(12) United States Patent
Kobayashi et al.

(10) Patent No.: US 8,820,977 B2
(45) Date of Patent: Sep. 2, 2014

(54) LIGHT EMITTING DEVICE AND DISPLAY APPARATUS

(75) Inventors: Izushi Kobayashi, Tokyo (JP); Katsuhisa Ito, Tokyo (JP); Hiroki Kikuchi, Kanagawa (JP); Yukitoyo Ohshima, Gifu (JP)

(73) Assignee: Sony Corporation, Tokyo (JP)

( * ) Notice: Subject to any disclaimer, the term of this patent is extended or adjusted under 35 U.S.C. 154(b) by 220 days.

(21) Appl. No.: 13/173,188

(22) Filed: Jun. 30, 2011

(65) Prior Publication Data

US 2012/0008328 A1 Jan. 12, 2012

(30) Foreign Application Priority Data

Jul. 8, 2010 (JP) .................................. 2010-155732

(51) Int. Cl.
| | |
|---|---|
| *F21V 7/00* | (2006.01) |
| *F21V 3/00* | (2006.01) |
| *H04N 13/04* | (2006.01) |
| *H01L 33/54* | (2010.01) |
| *H01L 33/58* | (2010.01) |

(52) U.S. Cl.
CPC ................ *H01L 33/54* (2013.01); *H01L 33/58* (2013.01); *H04N 13/0447* (2013.01); *H04N 13/0409* (2013.01); *H04N 2213/001* (2013.01)
USPC .................................. 362/296.01; 362/311.01

(58) Field of Classification Search
CPC ......... H01L 33/54; H01L 33/58; H01L 33/60; H04N 13/0409; G02B 3/0056; G02B 6/0053; G02B 3/005; G02B 3/0006; G02B 6/0026; G02B 6/003; G02F 2001/133607
USPC .......................... 362/296.01; 257/98; 359/619
See application file for complete search history.

(56) References Cited

U.S. PATENT DOCUMENTS

| | | | | |
|---|---|---|---|---|
| 4,425,501 | A * | 1/1984 | Stauffer ........................ | 250/216 |
| 6,535,338 | B2 * | 3/2003 | Nishikawa .................... | 359/619 |
| 6,618,201 | B2 * | 9/2003 | Nishikawa et al. ........... | 359/619 |
| 7,355,284 | B2 * | 4/2008 | Negley ........................... | 257/778 |
| 8,259,257 | B2 * | 9/2012 | Akiba et al. ..................... | 349/69 |
| 2005/0007669 | A1 * | 1/2005 | Sakai ............................ | 359/619 |
| 2007/0217019 | A1 * | 9/2007 | Huang et al. .................. | 359/642 |
| 2008/0084693 | A1 * | 4/2008 | Shimada et al. .............. | 362/240 |
| 2008/0315215 | A1 | 12/2008 | Horio et al. | |
| 2009/0168035 | A1 | 7/2009 | Kim et al. | |
| 2010/0110686 | A1 * | 5/2010 | Li et al. ..................... | 362/249.06 |
| 2012/0007108 | A1 | 1/2012 | Kobayashi et al. | |
| 2012/0008204 | A1 | 1/2012 | Kobayashi et al. | |
| 2012/0008262 | A1 | 1/2012 | Kobayashi et al. | |
| 2012/0008317 | A1 | 1/2012 | Kobayashi et al. | |
| 2013/0215505 | A1 | 8/2013 | Kobayashi et al. | |

FOREIGN PATENT DOCUMENTS

| | | |
|---|---|---|
| JP | 2004-177709 A | 6/2004 |
| JP | 2005-114771 A | 4/2005 |

* cited by examiner

*Primary Examiner* — David J Makiya
(74) *Attorney, Agent, or Firm* — Wolf, Greenfield & Sacks, P.C.

(57) ABSTRACT

A light emitting device includes: a light emitting chip arranged on a substrate; and a resin lens formed to cover the light emitting chip, wherein the center of the light emitting chip and the center of the resin lens are offset so that the centers do not match each other.

16 Claims, 25 Drawing Sheets

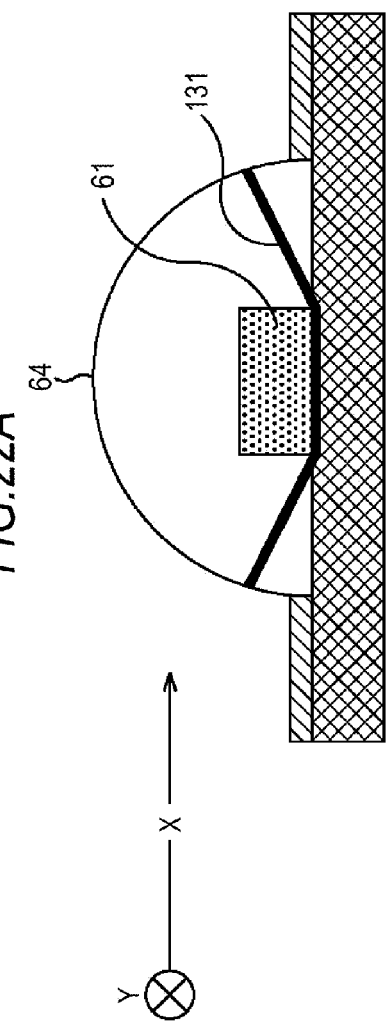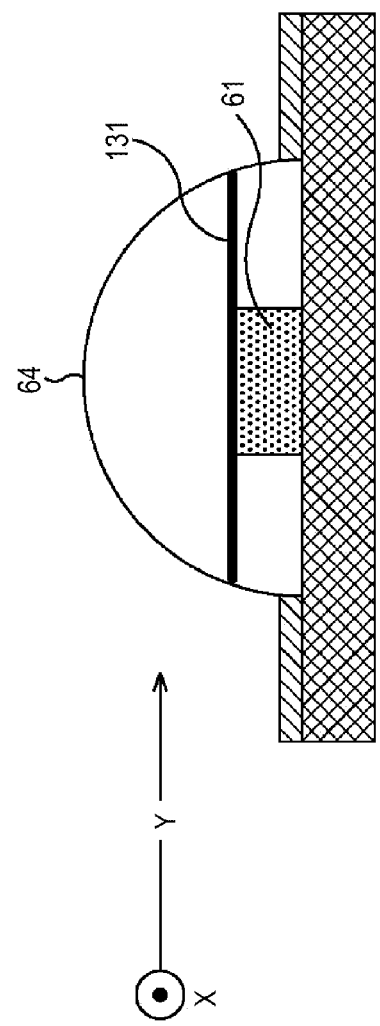

LIGHT DISTRIBUTION CHARACTERISTIC X

LIGHT DISTRIBUTION CHARACTERISTIC Y

FIG.25
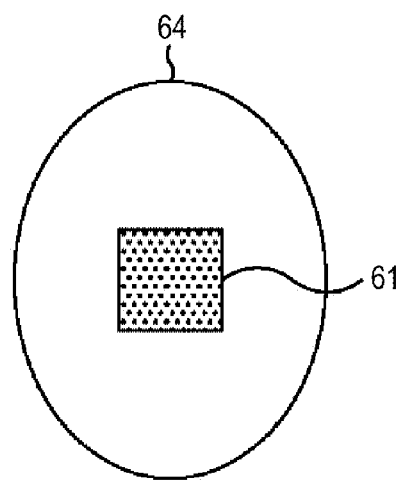
FIG.26A                    FIG.26B
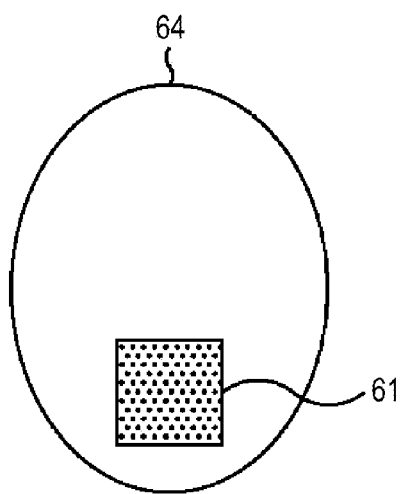    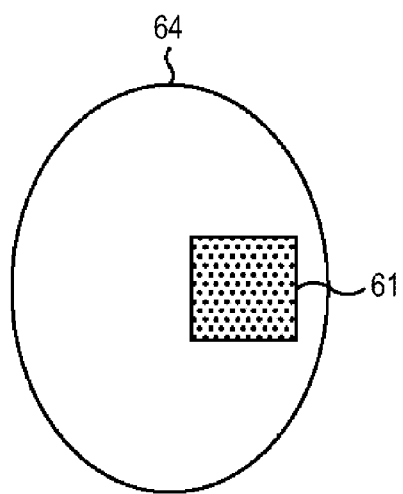

LIGHT EMITTING DEVICE AND DISPLAY APPARATUS

FIELD

The present disclosure relates to a light emitting device and a display apparatus, and in particular, to a light emitting device and a display apparatus capable of displaying an image that is visible stereoscopically from all directions.

BACKGROUND

In the related art, there has been a 3D display technology in which a 3D image is displayed on a flat display which is applied to a television set or the like. The 3D display technology uses binocular parallax between left and right eyes of a person who views a display, for example. Specifically, for example, a left eye image and a right eye image are alternately displayed on the flat display, and only the left eye image is viewed in the left eye and only the right eye image is viewed in the right eye using a polarizing filter or the like disposed therebetween, to thereby realize stereoscopic vision.

On the other hand, there have been proposed a variety of omni-directional 3D image display apparatuses which use a plurality of images (hereinafter, referred to as a viewpoint image) having different viewpoints captured (or generated in consideration of a case where an object is viewed over the entire periphery thereof by computer graphics) from a plurality of viewpoints disposed on the circumference around the object and perform a display so that the object can be stereoscopically viewed from an arbitrary direction of the entire periphery (for example, refer to JP-A-2004-177709 or JP-A-2005-114771).

In such omni-directional 3D image display apparatuses, display sections having a multiplicity of small LEDs (light emitting diode) or the like are arranged inside a cylindrical casing, the casing is formed with slits, and images of the display sections can be viewed from the outside of the casing through the slits. Further, as the casing rotates at high speed, the images of the display sections can be stereoscopically viewed by the user who views a side surface of the cylindrical casing in an arbitrary direction.

SUMMARY

As described above, since the images in the display sections installed inside the casing are viewed through the slits formed on the casing in the omni-directional 3D image display apparatus, the LEDs which form the display sections should have a high directional characteristic toward the slits.

However, in the related art, there has not been established a method of focusing the irradiation directions of the small LEDs which form the display sections in a predetermined direction, that is, of enhancing the directional characteristic. Accordingly, if the display sections are configured by using a large number of LEDs in the related art, since light usage efficiency deteriorates and power conservation is counteracted, it is necessary to develop a technique for adjusting the directional characteristic of the LEDs.

Accordingly, it is desirable to provide a light emitting device and a display apparatus which are capable of adjusting the directional characteristic of a light emitting device such as an LED.

An embodiment of the present disclosure is directed to a light emitting device including: a light emitting chip installed on a substrate; and a resin lens formed to cover the light emitting chip. Here, the center of the light emitting chip and the center of the resin lens are offset so that the centers do not match each other.

The resin lens may be formed in the form of a circle having the same aspect ratio in an X direction on the substrate and in a Y direction on the substrate which is perpendicular to the X direction.

The resin lens may be formed in the form of an ellipse having different aspect ratios in an X direction on the substrate and in a Y direction on the substrate which is perpendicular to the X direction.

The light emitting device may further include a mask having a plurality of holes.

The mask may cover an area other than the resin lens.

The mask may be formed of a black matte metal.

The mask may be processed so that the surface thereof has low reflectivity.

The mask may be processed so that a wall surface of the hole has high reflectivity.

The mask may be formed so that a cross-sectional shape of a lower layer thereof is narrower than that of an upper layer thereof.

The mask may be formed so that a cross-sectional shape of a lower layer thereof is wider than that of an upper layer thereof.

Another embodiment of the present disclosure is directed to a display apparatus in which a plurality of light emitting devices are arrayed. The light emitting device includes a light emitting chip installed on a substrate; and a resin lens formed to cover the light emitting chip. Here, the center of the light emitting chip and the center of the resin lens are offset so that the centers do not coincide with each other.

Still another embodiment of the present disclosure is directed to a light emitting device including: a light emitting chip installed on a substrate; a resin lens formed to cover the light emitting chip; and a reflector which reflects irradiation light from the light emitting chip. Here, the reflector has different reflection characteristics in an X direction on the substrate and a Y direction on the substrate which is perpendicular to the X direction.

Yet another embodiment of the present disclosure is directed to a display apparatus in which a plurality of light emitting devices are arrayed. The light emitting device includes a light emitting chip installed on a substrate; a resin lens formed to cover the light emitting chip; and a reflector which reflects irradiation light from the light emitting chip. Here, the reflector has different reflection characteristics in an X direction on the substrate and a Y direction on the substrate which is perpendicular to the X direction.

Still yet another embodiment of the present disclosure is directed to a light emitting device including: a light emitting chip installed on a substrate; and a resin lens formed to cover the light emitting chip. The resin lens is formed in the form of an ellipse having different aspect ratios in an X direction on the substrate and in a Y direction on the substrate which is perpendicular to the X direction.

Further another embodiment of the present disclosure is directed to a display apparatus in which a plurality of light emitting devices are arrayed. The light emitting device includes a light emitting chip installed on a substrate; and a resin lens formed to cover the light emitting chip. Here, the resin lens is formed in the form of an ellipse having different aspect ratios in an X direction on the substrate and in a Y direction on the substrate which is perpendicular to the X direction.

According to the embodiments of the above-described embodiments, it is possible to adjust the directional characteristic of the light emitting device.

Further, according to the embodiments of the above-described embodiments, it is possible to display an image having high light usage efficiency.

BRIEF DESCRIPTION OF THE DRAWINGS

FIGS. 22A and 22B are cross-sectional views of a seventh configuration example of the LED;

FIG. 25 is a top view of a ninth configuration example of the LED;

FIGS. 26A and 26B are top views of a tenth configuration example of the LED.

DETAILED DESCRIPTION

Hereinafter, preferred embodiments (hereinafter, referred to as "embodiments") of the present disclosure will be described in detail with reference to the accompanying drawings.

1. First Embodiment

[Configuration Example of a 3D Image Display System]

Figure 1:
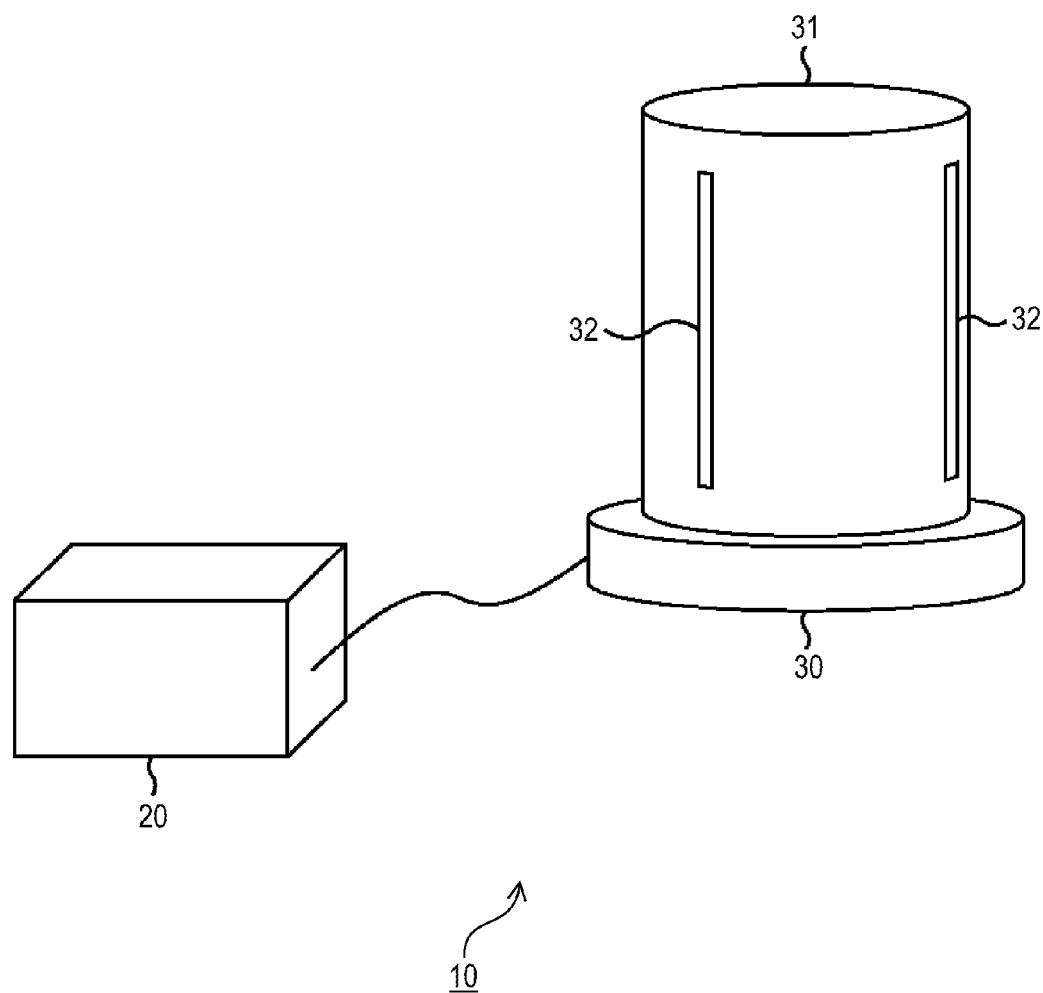
FIG. 1 is a diagram illustrating an example of a configuration of a 3D image display system according to an embodiment of the present disclosure.

FIG. 1 illustrates an example of a configuration of a 3D image display system according to an embodiment of the present disclosure. The 3D image display system 10 includes an image signal processing device 20 and an omni-directional 3D image display apparatus 30.

The image signal processing device 20 supplies a video signal obtained by capturing an object, for example, from all directions to the omni-directional 3D image display apparatus 30.

The omni-directional 3D image display apparatus 30 includes a display section 40 (FIG. 2) which is installed in a cylindrical section 31 which is formed with a plurality of slits 32. The display section 40 includes array displays of the same number as the number of the slits 32. The omni-directional 3D image display apparatus 30 extracts images in the case where the object is seen from respective viewpoints on the entire periphery around the object from a video signal input from the image signal processing device 20 to display the images on the respective array displays in a predetermined order. Accordingly, the cylindrical section 31 rotates at high speed.

Thus, the images on the array displays which form the display section 40 pass through the slits 32 and are seen by a user who views a side surface of the cylindrical section 31 of the omni-directional 3D image display apparatus 30. Since LED lights of R, G, and B components which are arranged in positions corresponding to the plurality of array displays are synthesized and seen, the images have their original colors, and in a case where the user views the side surface of the cylindrical section 31 from an arbitrary direction, the user can view a 3D image over the entire periphery of the object in the video signal.

[Configuration Example of a Display Section]

Figure 2:
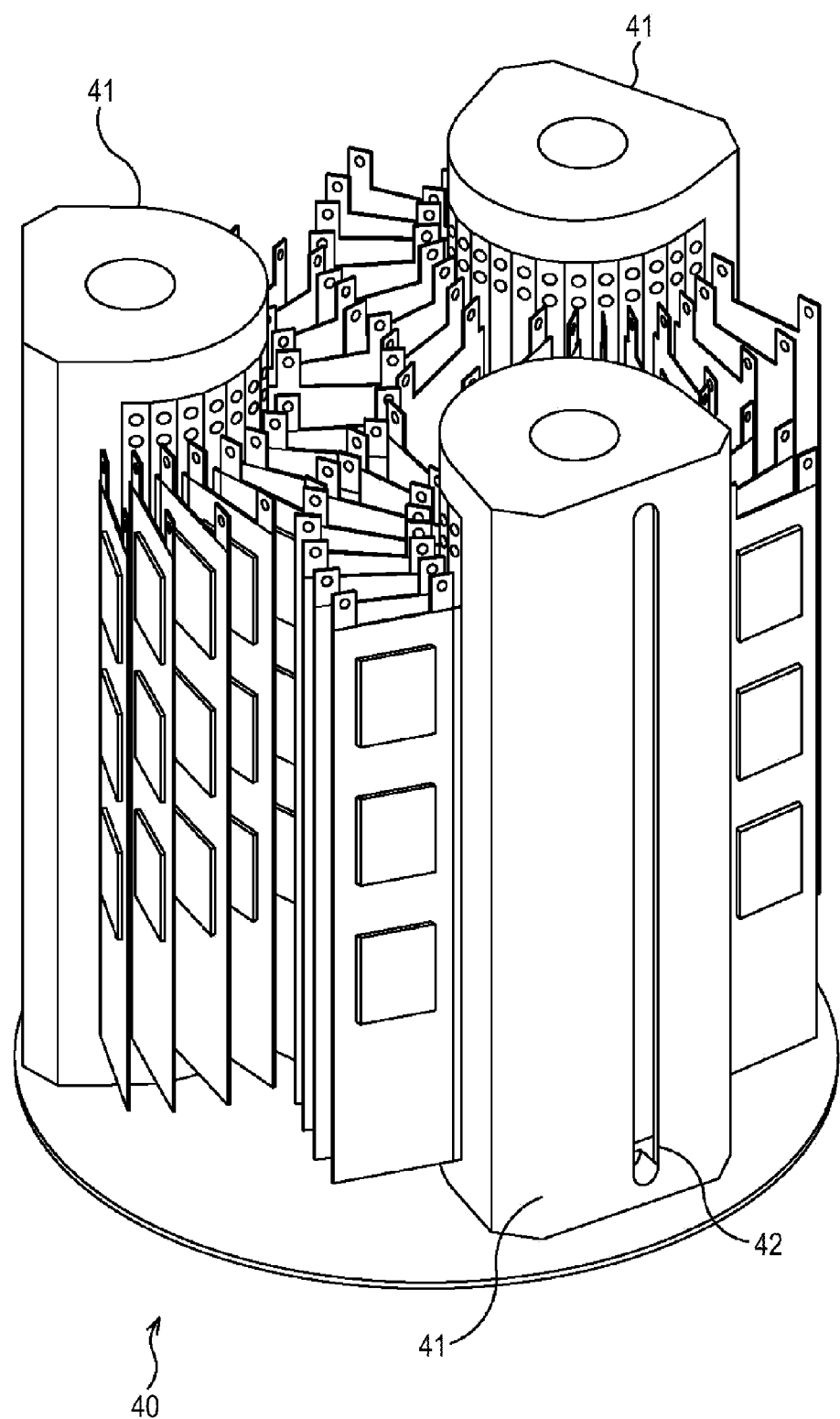
FIG. 2 is a perspective view illustrating a display section which is installed in an omni-directional 3D image display apparatus.
Figure 3:
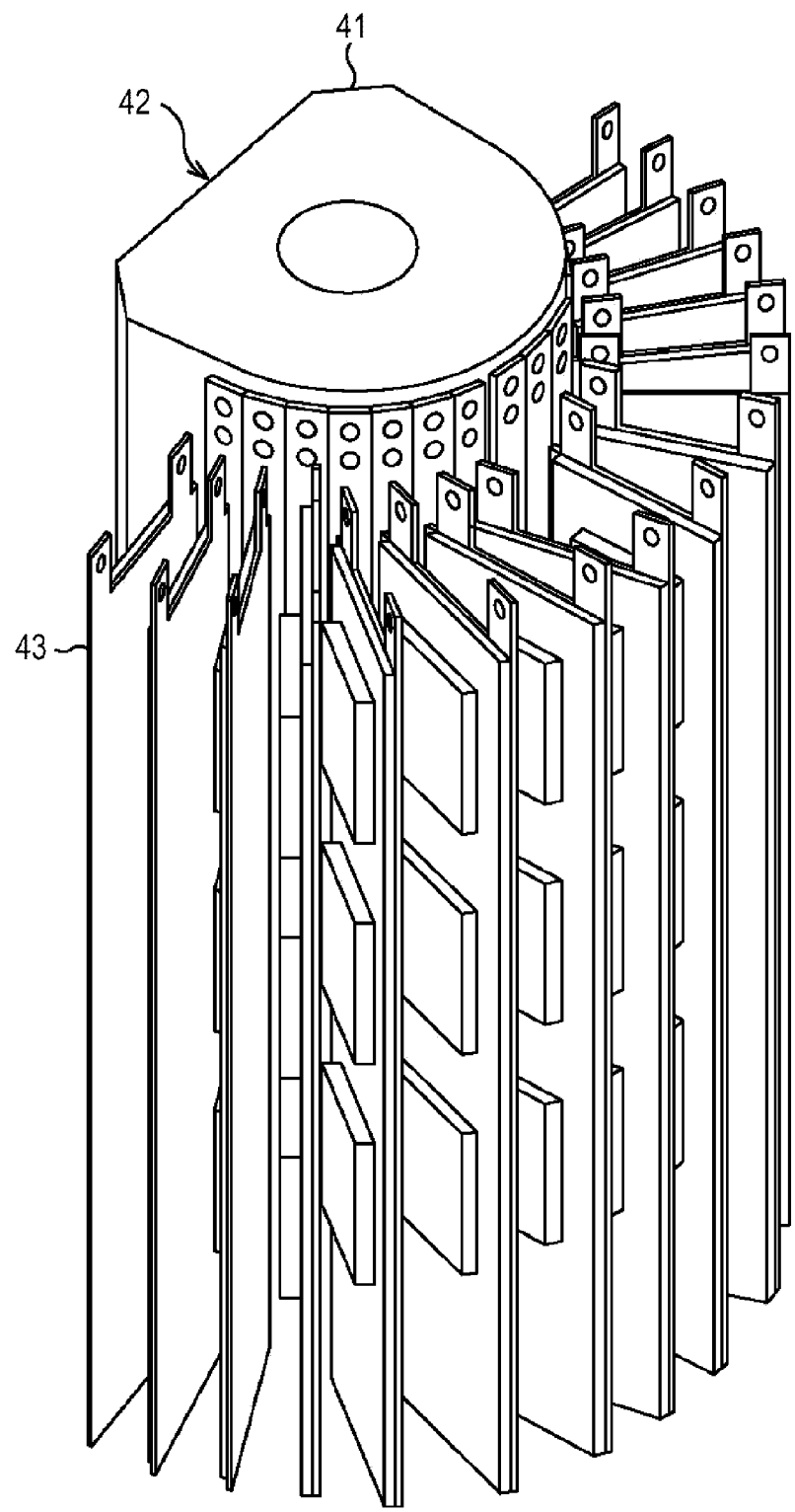
FIG. 3 is a rear perspective view of array displays including a light housing and a light emitting device substrate.
Figure 4:
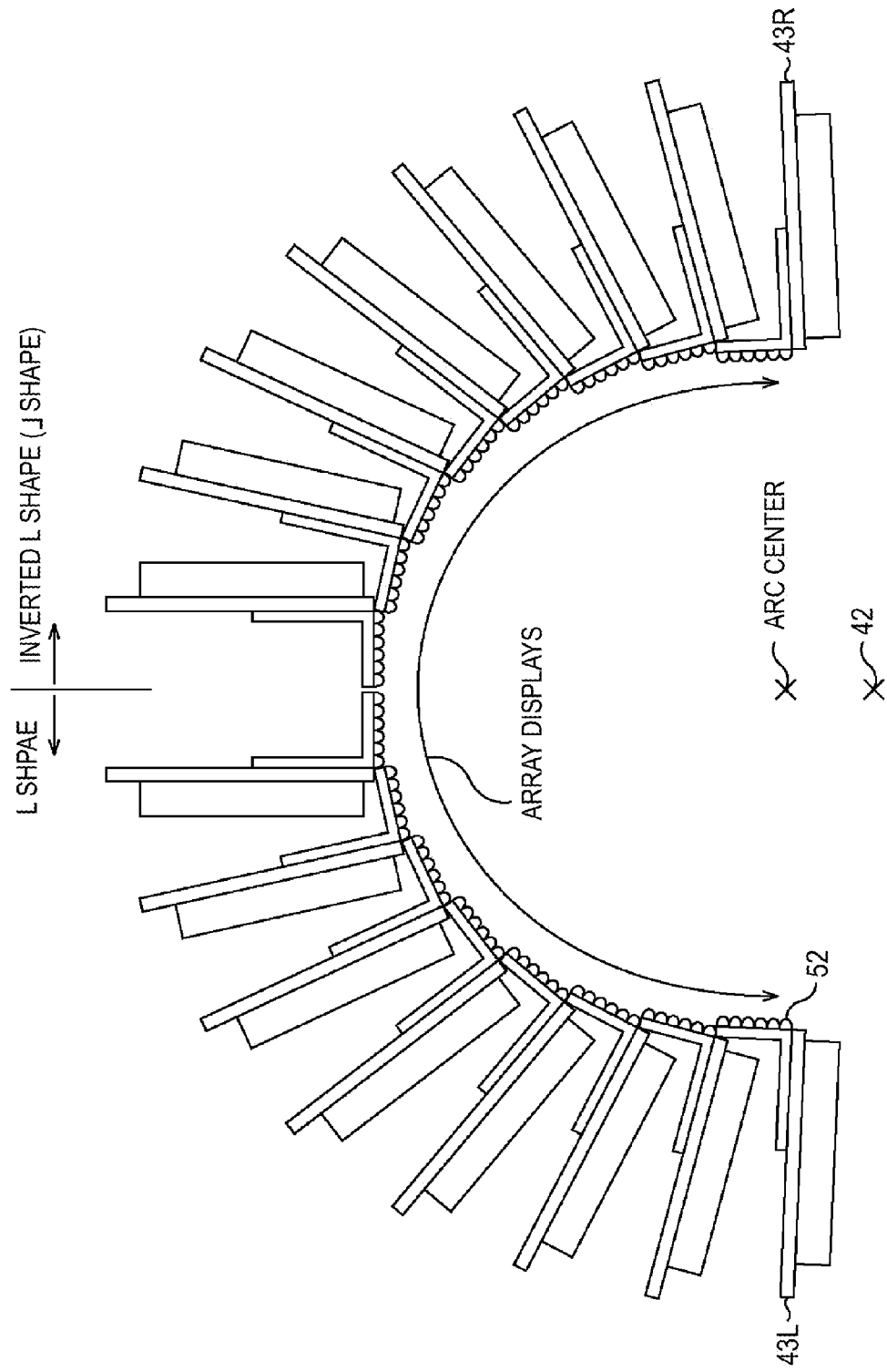
FIG. 4 is a cross-sectional view of the array displays.
Figure 5:
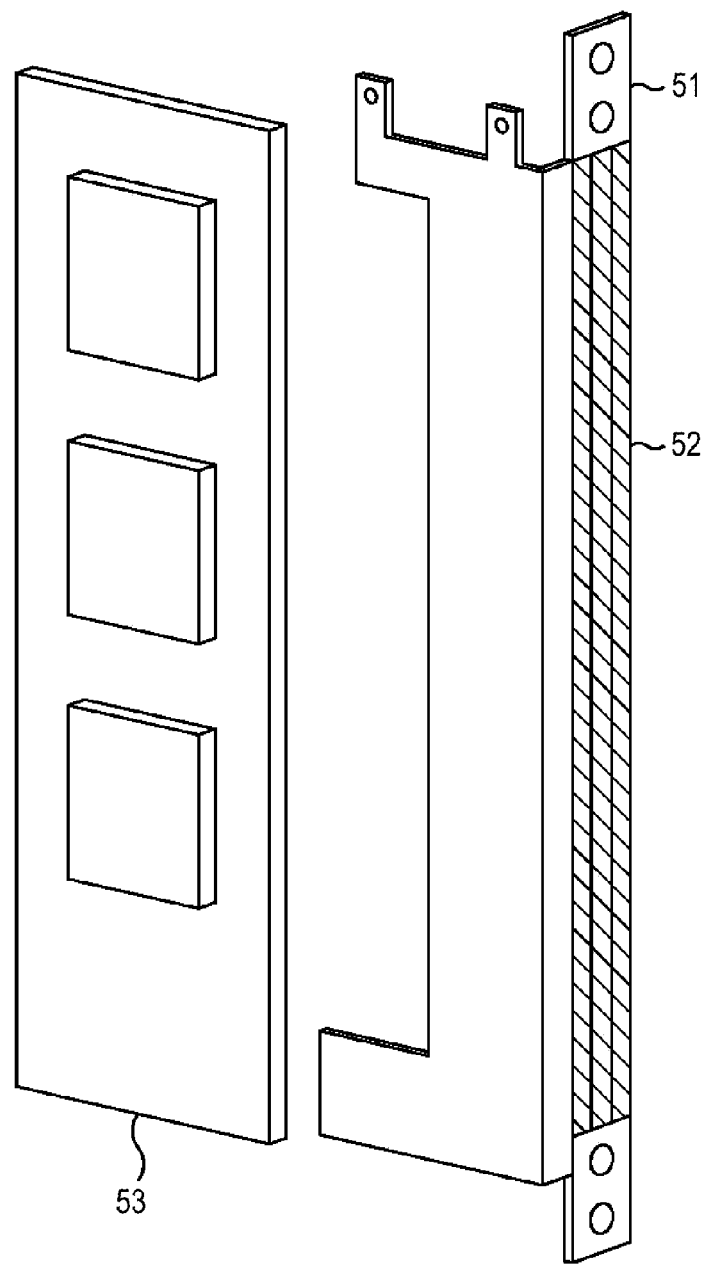
FIG. 5 is a perspective view of the light emitting device substrate.
Figure 6:
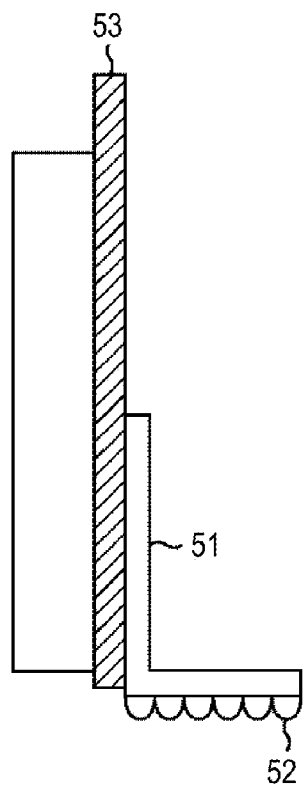
FIG. 6 is a cross-sectional view of the light emitting device substrate.

A configuration example of the display section 40 which is installed in the cylindrical section 31 of the omni-directional 3D image display apparatus 30 will be described with reference to FIGS. 2 to 6. FIG. 2 is a configuration example of the display section 40, FIG. 3 is a rear perspective view of array displays, FIG. 4 is a cross-sectional view of the array displays, FIG. 5 is a perspective view of a light emitting device substrate 43, and FIG. 6 is a cross-sectional view of the light emitting device substrate 43.

In the case of the configuration example shown in FIG. 2, the display section 40 includes three array displays. Each array display is installed in a light housing 41 so that a curved surface is formed along respective LED surfaces 52 of the plurality of light emitting device substrates 43.

Each light housing 41 is arranged at an equiangular (here, 120 degrees) interval in a base of the cylindrical section 31. Thus, it is possible to reduce wobbling of a rotation axis when the cylindrical section 31 rotates.

A slit 42 is formed on a side surface of the light housing 41, and the display section 40 is installed inside the cylindrical section 31 so that the slit 42 corresponds to the slit 32 formed in the cylindrical section 31.

The light housing 41 has an approximately semi-cylindrical shape of a hollow structure, and a positioning hole for mounting the light emitting device substrate 43 is formed on the side surface thereof of an arc shape. Thus, it is possible to mount the light emitting device substrate 43 on a predetermined location of the light housing 41 with high accuracy. Further, the plurality of light emitting device substrates 43 are mounted in the form of fins along the positioning holes. It is possible to efficiently dissipate heat generated by the light emitting device substrate 43 or the like when the display section 40 rotates, using the above-described shape characteristic.

Further, a hole is formed on an upper surface and a lower surface of the light housing 41. Thus, if the display section 40 rotates, since air flow is generated in the light housing through the vertical hole, the heat exhausting is accelerated.

The light emitting device substrate 43 has attachments 51 for installation to the light housing 41 in opposite ends in the length direction thereof. The attachment 51 employs a material having high thermal conductivity such as aluminum. Thus, it is possible to efficiently move the heat generated by the light emitting device substrate 43 toward the light housing 41, or to dissipate the heat.

Further, the light emitting device substrate 43 has a cross-section of an L shape (or inverted L shape), and has a rectangular LED surface 52 in which a plurality of LEDs which are the light emitting devices are disposed in a position which is a short side of the L shape. That is, the length direction of the LED surface 52 is parallel to the slit 42 of the light housing 41. Further, a driver substrate 53 for driving the LEDs is disposed in a position which is along side of the light emitting device substrate 43.

As shown in FIG. 4, the array displays have an arc screen. That is, the array displays are configured so that the respective LED surfaces 52 of the plurality of light emitting device substrates 43 are arranged to be connected in an arc shape toward a point on a line which connects an arc center of the screen and the slit 42 of the light housing 41. Thus, usage efficiency of light emitted from the LEDs can be enhanced. Further, since a gap between the respective light emitting device substrates 43 is generated, the generated heat can be dissipated therethrough.

Further, the plurality of light emitting device substrates 43 which form the array displays use an L-shaped cross-section and an inverted L-shaped cross-section with reference to the center of the array displays. Thus, it is possible to prevent horizontal unevenness in an image due to steps in the screen (for example, pixel gaps in a longitudinal direction stand out only on the right (or left) side of the screen), which may be generated in a case where the array displays are configured using only one of the L shape and the inverted L shape.

[Configuration Example of an LED]

Next, the LED which forms the LED surface 52 will be described with reference to FIGS. 7 to 13. As described above, the LED surface 52 is arranged toward the line where the arc center of the array displays is connected to the slit 42. Further, each LED of the LED surface 52 is configured so that directional characteristics of the irradiation light is enhanced compared with the LED of the related art, and light usage efficiency is enhanced.

Figure 7:
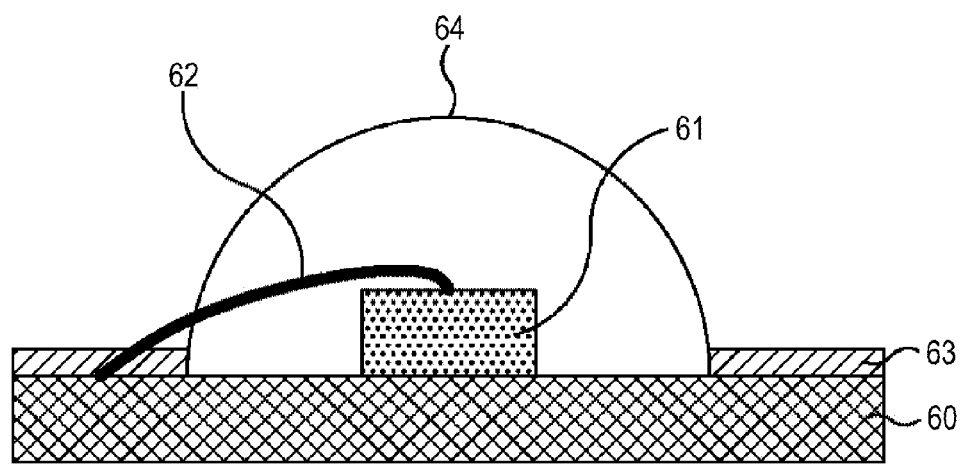
FIG. 7 is a cross-sectional view of a first configuration example of an LED.

FIG. 7 illustrates a first configuration example of the LED which forms the LED surface 52. In the first configuration example, a resin lens 64 is formed to cover an LED chip 61 around the LED chip 61 installed on a substrate 60. The irradiation light of the LED can be focused on the front surface by circularly forming the resin lens 64 when seen from the top of the LED, and thus, stray light is reduced, thereby enhancing light usage efficiency. Accordingly, the contrast of the displayed image is enhanced. Further, since an apparent light emitting area increases, it is possible to restrict a dot effect of the 3D image from standing out.

Further, in order to form the position and shape of the resin lens 64 with high accuracy, a water repellent and oil repellent agent or the like is coated in a region of the substrate 60 other than a region where the resin lens 64 is formed, to thereby form a low surface tension film 63. That is, by forming the low surface tension film 63 with high positional accuracy, it is possible to form the position and shape of the resin lens 64 with high accuracy.

Figure 8:
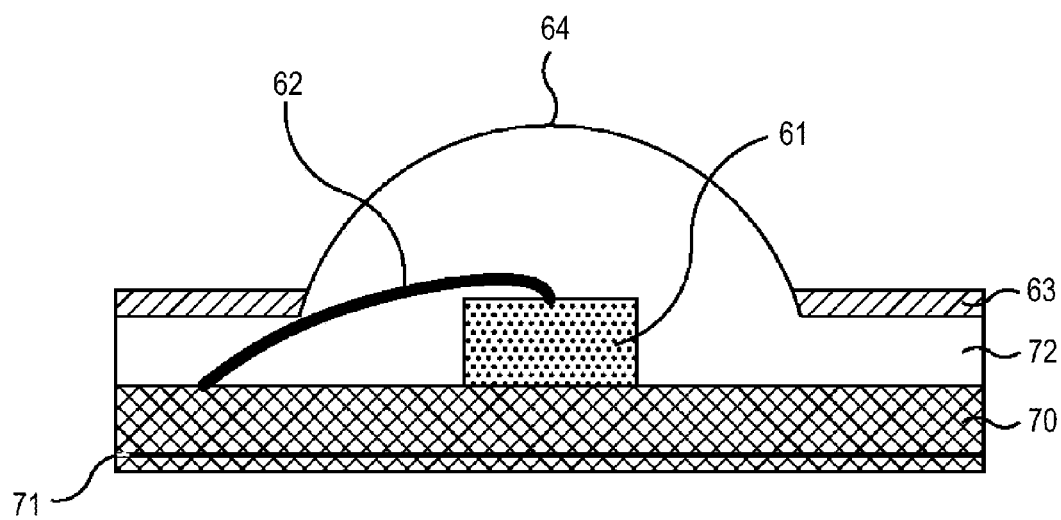
FIG. 8 is a cross-sectional view of a second configuration example of the LED.

FIG. 8 illustrates a second configuration example of the LED which forms the LED surface 52. In the second configuration example, in addition to the same characteristic as the above-described first configuration example, a resin coat 72 is formed to cover a wire 62 which is wired in the LED chip 61. Thus, protection of the wire 62 and insulation maintenance can be secured in parallel. In the second configuration example, the height of the resin coat 72 is formed to be lower than the height of the light emitting surface of the LED chip 61. Thus, it is possible to restrict reduction in light extraction efficiency due to inner reflection of the LED. Here, the height of the resin coat 72 may be formed to be higher than the height of the light emitting surface of the LED chip 61. Thus, since directional characteristic is enhanced while the light extraction efficiency decreases as the distance between the LED chip 61 and the resin lens 64 increases, it is possible to enhance light usage efficiency as a result. Further, as the height of the resin coat 72 increases, it is possible to avoid contact between the wire 62 and a mask 81 (to be described later).

Further, in the second configuration example, a copper foil layer 71 is formed on a substrate 70. Thus, temperature unevenness in the substrate 70 can be reduced, and thus, luminance unevenness and color unevenness in the LED surface 52 can be restricted.

Figure 9:
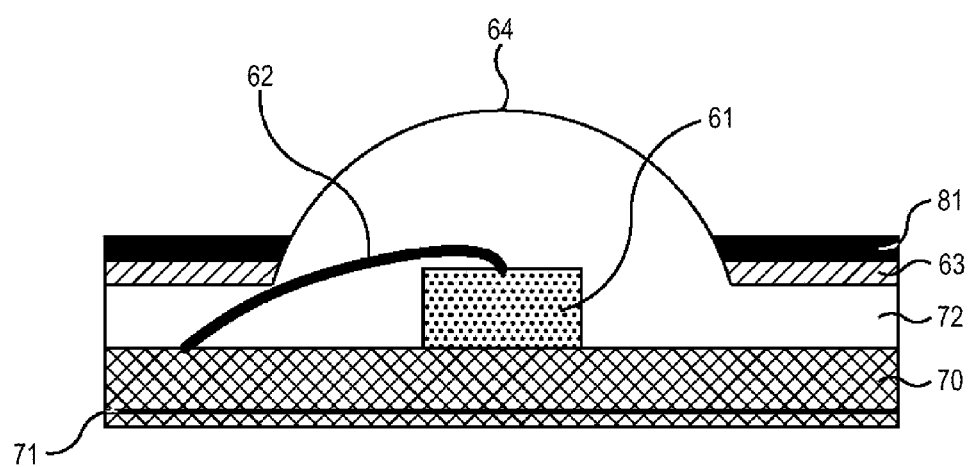
FIG. 9 is a cross-sectional view of a third configuration example of the LED.

FIG. 9 illustrates a third configuration example of the LED which forms the LED surface 52. In the third configuration example, in addition to the same characteristic as the above-described second configuration example, the mask 81 is installed to cover a portion other than the resin lens 64 on the highest layer. The mask 81 may use a metallic foil which is black matte surface-processed or insulation-processed, black matte resin sheet, or the like.

The mask 81 has characteristic in the cross-sectional shape thereof. FIGS. 10A to 10D illustrate three examples of the cross-section shapes of the mask 81.

Figure 10A:
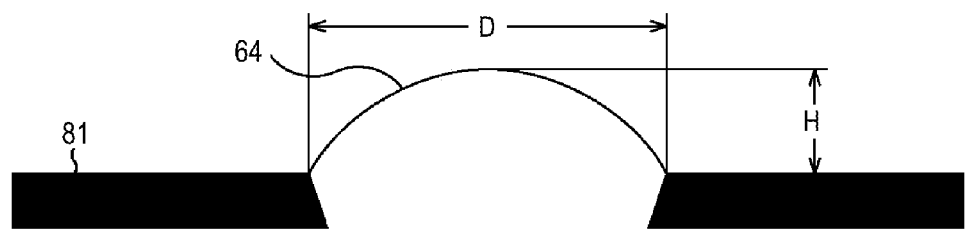
FIGS. 10A to 10D are diagrams illustrating three examples of cross-sectional shapes of a mask.
Figure 10B:
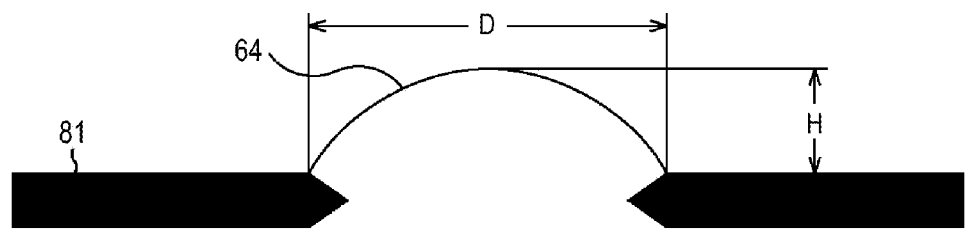

That is, FIG. 10A represents an example where a cross-sectional shape of the mask 81 is formed so that a lower side thereof is narrower than an upper side thereof. FIG. 10B represents an example where a cross-sectional shape of the mask 81 is formed to be widened toward an upper side and a lower side from the center of the layer of the mask 81 (corresponding to the case where the mask 81 is created by etching). Further, FIG. 10C represents an example where a cross-section shape of the mask 81 is formed so that a lower side thereof is wider than an upper side thereof.

Figure 10C:
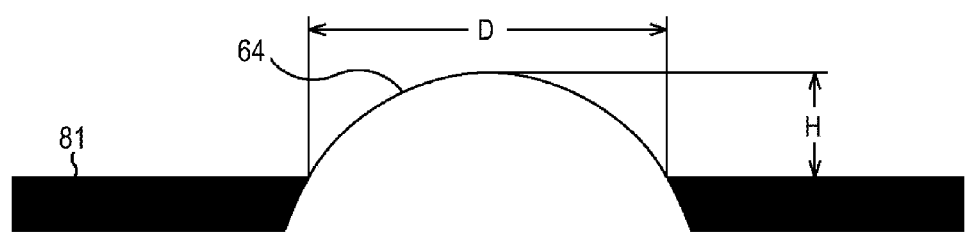
Figure 10D:
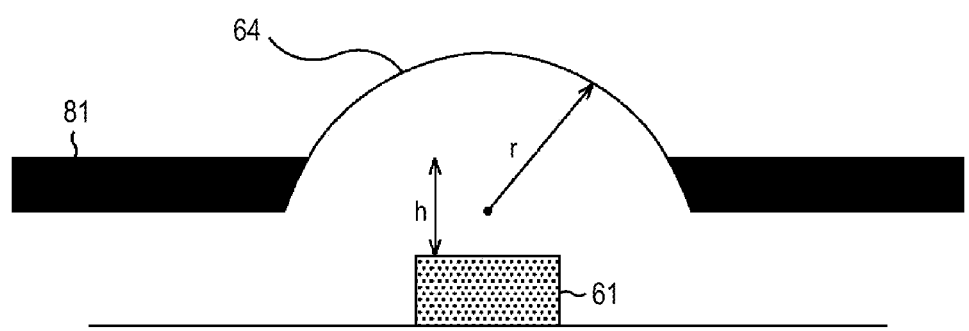

From the point of view that the resin lens 64 is formed with a dome shape with high accuracy, the example in FIG. 10A and the example in FIG. 10B are the same, which are superior to the example in FIG. 10C. Further, also, from the point of view that an aspect ratio (H/D) which is the ratio of the height H to the diameter D of the resin lens 64 can be increased, the example in FIG. 10A and the example in FIG. 10B are the same, which are also superior to the example in FIG. 10C.

Here, this does not mean that the directional characteristic and light usage efficiency are enhanced as the aspect ratio increases. That is, if the lens is formed with an appropriate aspect ratio according to a distance "h" from the light emitting surface of the LED chip 61 to the upper surface of the mask 81 or a hole diameter "r" of the mask 81, the directional characteristic thereof increases, and thus, light usage efficiency can be enhanced.

From the point of view that interference (contact) of the mask 81 with the wire 62 is prevented, the example in FIG. 10C is superior to the example in FIG. 10A and the example in FIG. 10B.

Figure 11:
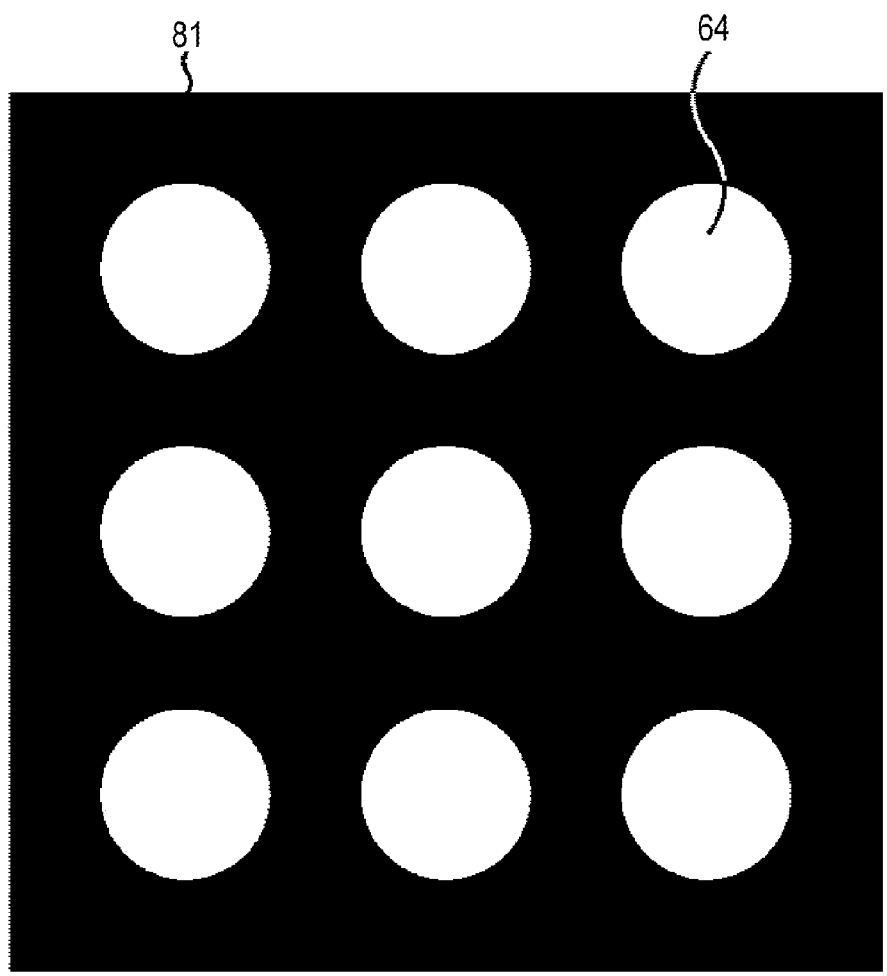
FIG. 11 is a top view of the LEDs in which the mask is installed.

FIG. 11 illustrates a top view of the LED surface 52 including the third configuration example of the LED. As shown in the figure, since light leakage from portions other than the resin lens 64 can be prevented by installing the mask 81, it is possible to reduce deterioration in the image contrast.

Figure 12:
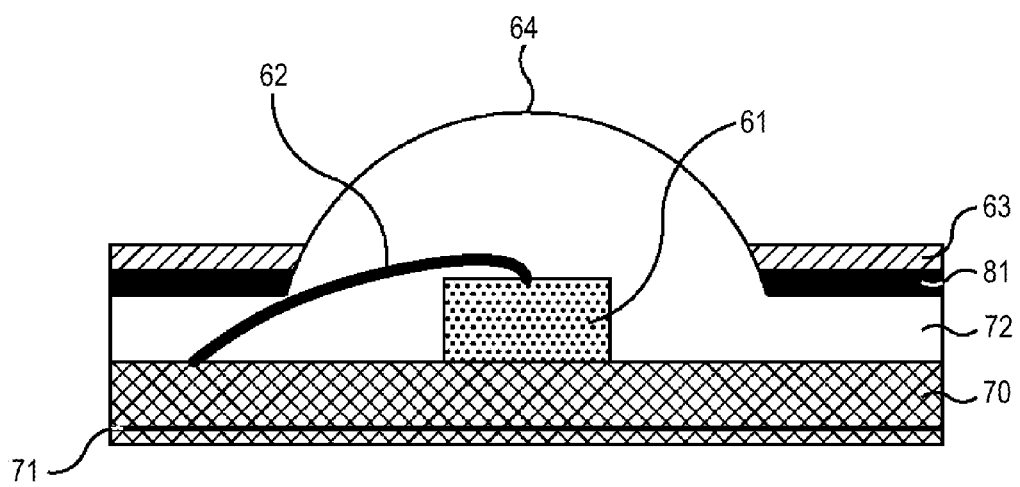
FIG. 12 is a cross-sectional view of a fourth configuration example of the LED.

FIG. 12 illustrates a fourth configuration example of the LED which forms the LED surface 52. In the fourth configuration example, the positions of the low surface tension film 63 and the mask 81 are switched in the above-described third configuration example, and thus, the low surface tension film 63 is formed on the highest layer, and the mask 81 is installed on the lower side compared with the third configuration example. Thus, it is possible to enlarge the diameter of the resin lens 64 compared with the third configuration example, without combining the resin lenses 64 of the adjacent LEDs, and thus, it is possible to increase the density of the resin lenses 64 in the LED surface 52. Further, as the diameter of the resin lens 64 increases, it is possible to enhance the extraction efficiency of the irradiation light. Accordingly, it is possible to reduce the dot effect of the displayed 3D image.

Figure 13:
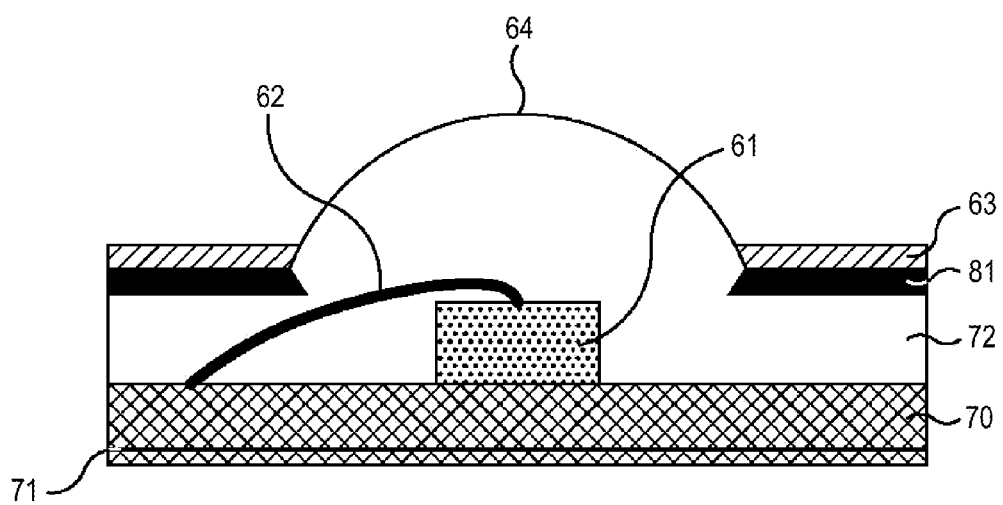
FIG. 13 is a cross-sectional view of a fifth configuration example of the LED.

FIG. 13 illustrates a fifth configuration example of the LED which forms the LED surface 52. The fifth configuration example has the same configuration as the above-described fourth configuration example. However, the height of the resin coat 72 is formed to be higher than the LED chip 61, and a cross-sectional shape of the mask 81 is formed so that a lower side thereof is narrower than an upper side thereof. Accordingly, in addition to the same effect as the fourth configuration example, it is possible to form the dome shape of the resin lens 64 with high accuracy according to the cross-sectional shape of the mask 81, to further enhance the directional characteristic as the distance between the LED chip 61 and the resin lens 64 increases, and to enhance the luminance of the displayed 3D image.

[Arrangement of LEDs]

Arrangement of LEDs which emit light of wavelengths of R, G, and B components in the LED surface 52 will be described. Hereinafter, the LEDs which emit light of wavelengths of the respective R, G, and B components are referred to as LEDs 90R, 90G, and 90B, respectively.

Figure 14:
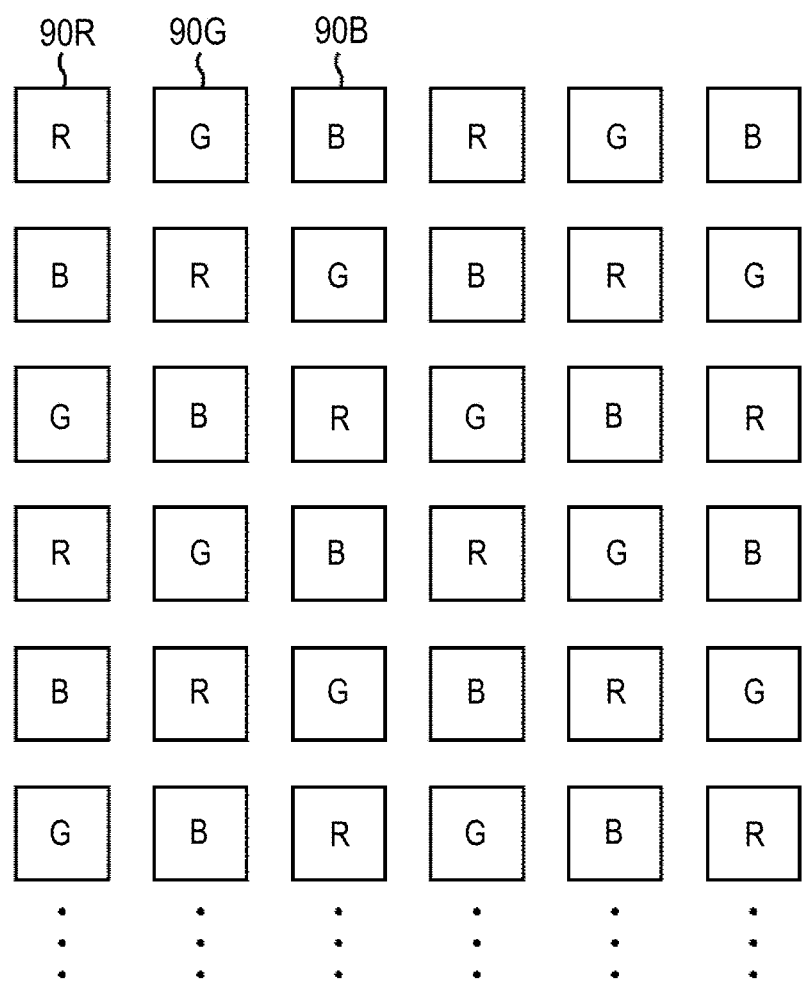
FIG. 14 is a diagram illustrating a first arrangement example of LEDs corresponding to respective color components of R, G, and B.

FIG. 14 illustrates a first arrangement example of the LED in the LED surface 52. The longitudinal direction in the same figure corresponds to the length direction of the LED surface 52. In the first arrangement example, with reference to arbitrary 3×3 LEDs, the number of LEDs of the respective color components is the same, and with reference to an arbitrary LED, the LED having the same color component as the referenced LED is not present on the adjacent up, down, right and left sides. Here, the first arrangement example is ideal, but is difficult to be manufactured compared with a second arrangement example which will be described later.

Figure 15:
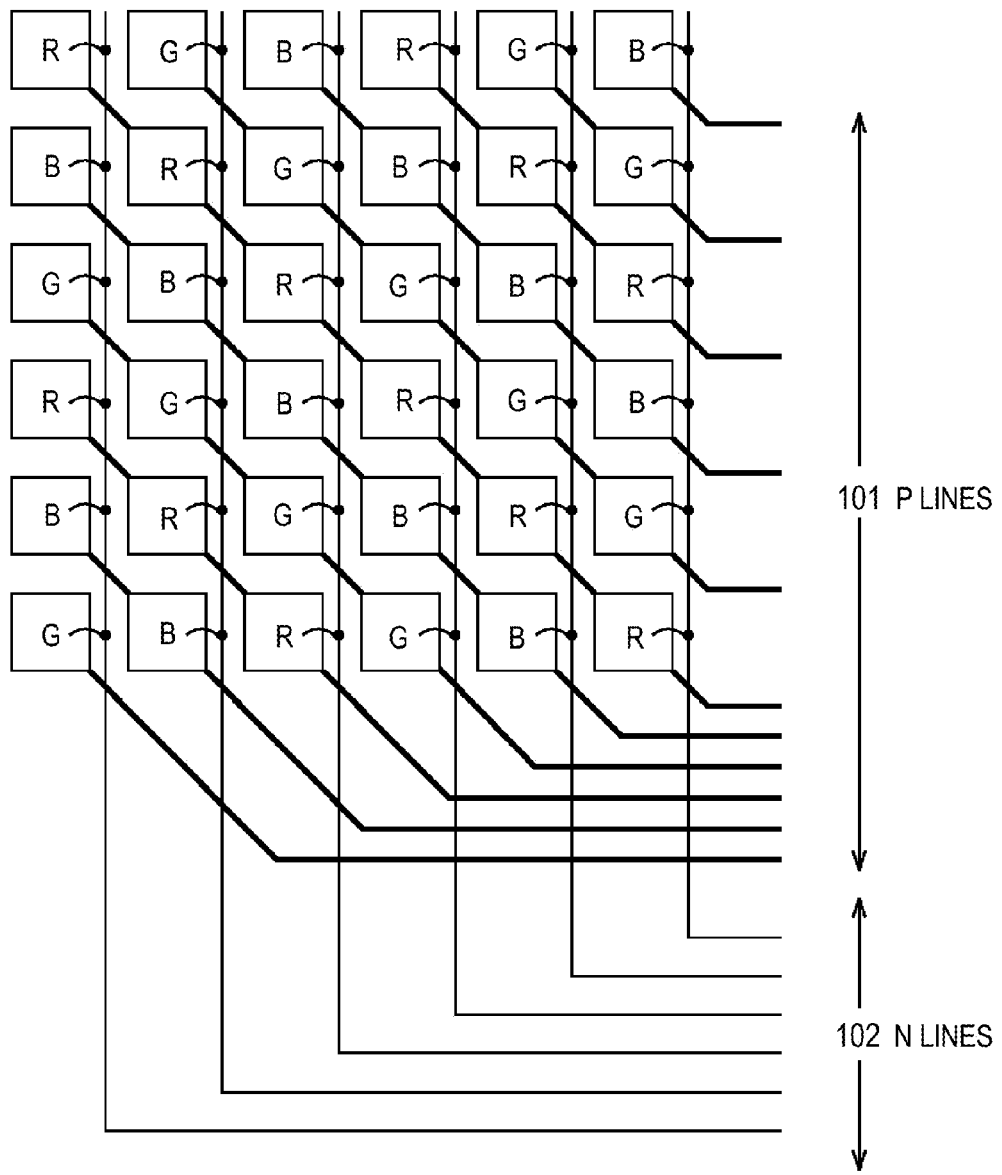
FIG. 15 is a diagram illustrating a first wiring example corresponding to the first arrangement example.

FIG. 15 illustrates a first wiring example corresponding to the first arrangement example shown in FIG. 14. The longitudinal direction in the figure corresponds to the length direction of the LED surface 52. In the first wiring example, "P" lines 101 for driving the LEDs of the same color components are wired in an oblique direction according to the arrangement of the LEDs of the same color components, and "N" lines 102 are wired along the length direction of the LED surface 52.

As the first wiring example is employed, it is possible to drive and control the LEDs which form the LED surface 52 in a line sequential manner in the unit of several μ seconds.

Figure 16:
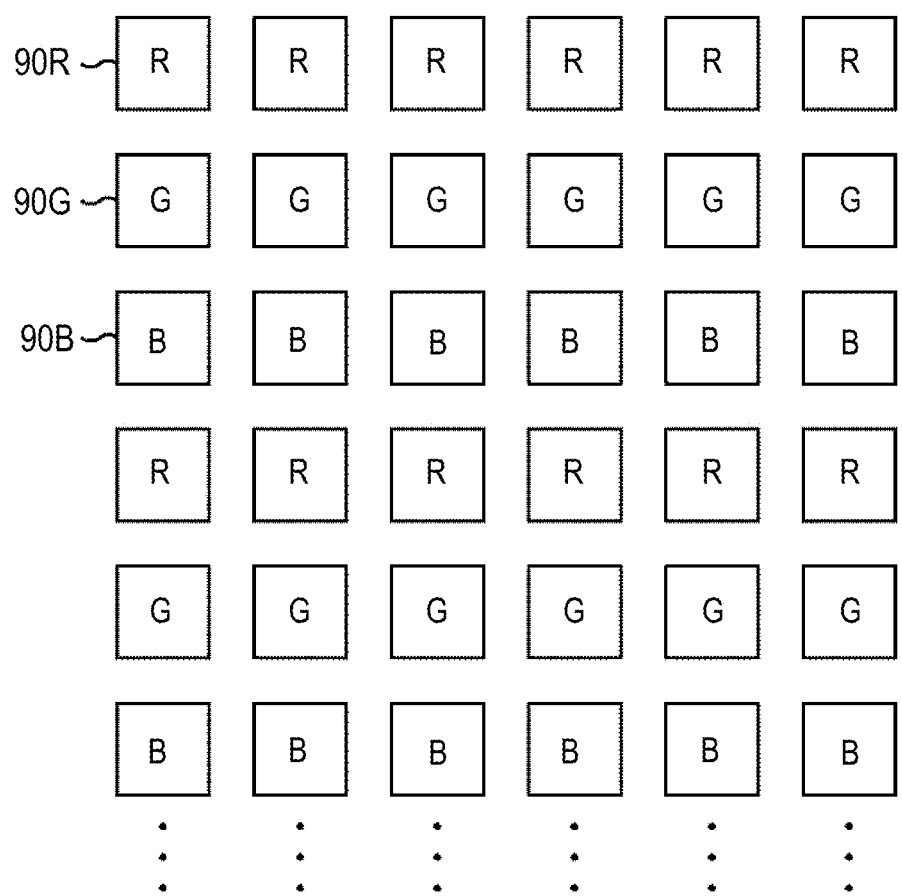
FIG. 16 is a diagram illustrating a second arrangement example of LEDs corresponding to respective color components of R, G, and B.

FIG. 16 illustrates a second arrangement example of the LEDs in the LED surface 52. The longitudinal direction in the figure corresponds to the length direction of the LED 52. In the second arrangement example, the LEDs in the transverse direction have the same color components. Here, with reference to arbitrary 3×3 LEDs, the number of LEDs of the respective color components is the same. The second arrangement example has a simplified structure easy to be manufactured compared with the first arrangement example.

As in the present embodiments, in a case where the display section 40 is configured by three light housings 41, LEDs having different colors are arranged on the corresponding positions of the respective array displays in the respective light housings 41. For example, in the case of the first arrangement example, with reference to the three LEDs which are arranged on the corresponding positions of three array displays, the LEDs are sequentially arranged in the order of R, G, and B in the first array display, are sequentially arranged in the order of G, B, and R in the second array display, and are sequentially arranged in the order of B, R, and G in the third array display.

As described above, as the cylindrical section 31 in which the display section 40 is installed rotates at high speed in the omni-directional 3D image display apparatus 30, colors of the LEDs of the respective R, G, and B components which are arranged on the corresponding positions of the respective array displays are combined to be seen. Accordingly, in a case where only LEDs of R, G, or B component are arranged in each of three array displays, if the rotational speed of the cylindrical section 31 becomes low, the combination state of the respective R, G, and B components is deteriorated, and the original colors cannot be reproduced. Further, color breakup of the image may occur.

However, as the above-described first arrangement example or the second arrangement example is employed, that is, as the LEDs of the respective R, G, and B components are mixed on one sheet of LED surface 52, even in a case where the rotational speed of the display section 40 is low, the occurrence of color breakup of the displayed 3D image and flickering can be restricted.

Figure 17:
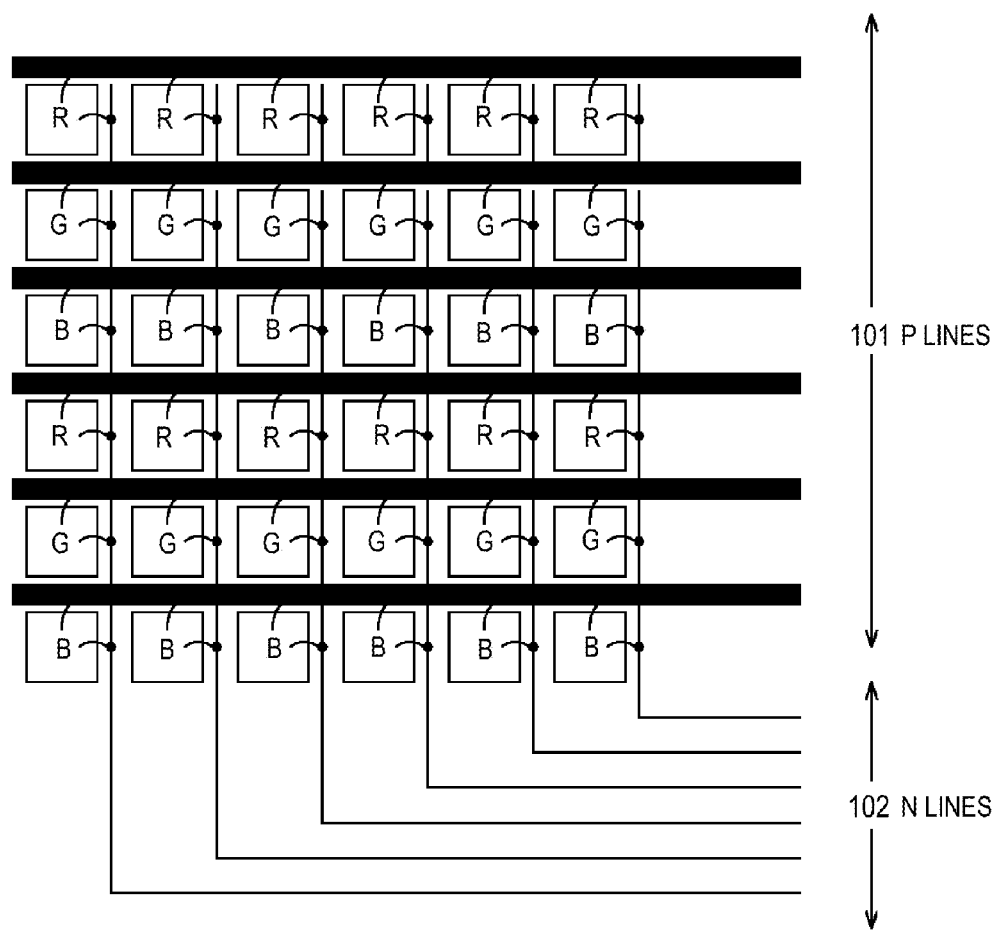
FIG. 17 is a diagram illustrating a second wiring example corresponding to the second arrangement example.

FIG. 17 illustrates a second wiring example corresponding to the second arrangement example shown in FIG. 16. The longitudinal direction in the figure corresponds to the length direction of the LED surface 52. In the second wiring example, the "P" lines 101 and the "N" lines 102 for driving the LEDs are arranged in the lattice form.

As the second wiring example is employed, it is possible to drive and control the LEDs which form the LED surface 52 in a line sequential manner in the unit of several μ seconds.

Incidentally, each LED which forms the LED surface 52 may not be directly mounted on the substrate, but a package type LED having a P electrode and an N electrode on a lower surface thereof may be arranged on the substrate.

Figure 18A:
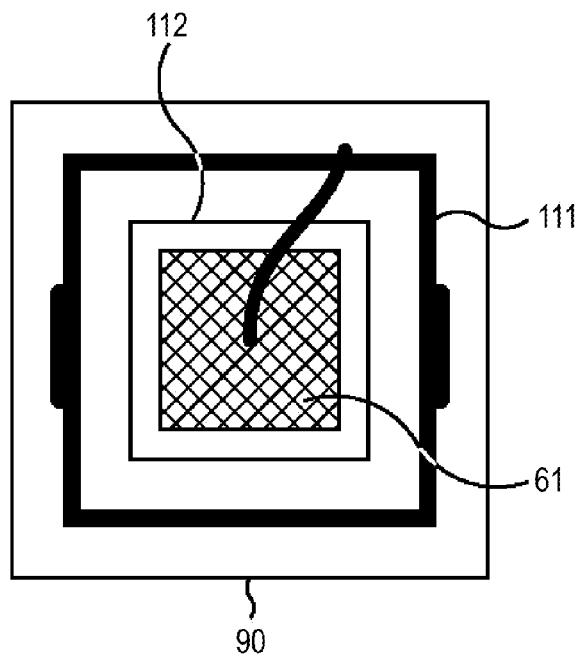
FIGS. 18A and 18B are diagrams illustrating an example of a configuration of a package type LED.
Figure 18B:
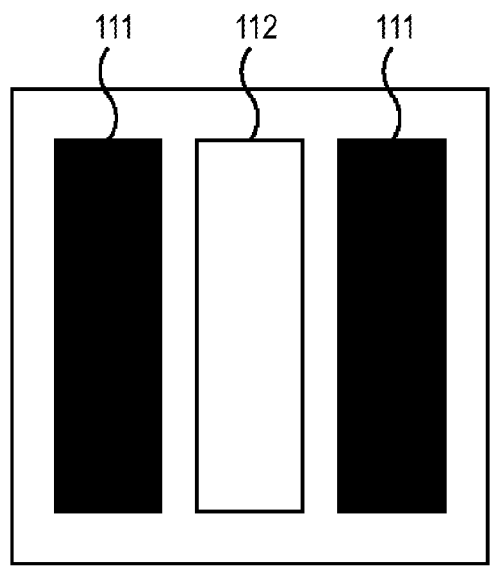

FIGS. 18A and 18B illustrate a configuration example of the package type LED, in which FIG. 18A illustrates a top surface thereof and FIG. 18B illustrates a lower surface thereof. As shown in FIG. 18A, a "P" terminal (electrode) 111 is installed on the top surface of the package type LED along the outer circumference thereof, and an "N" terminal (electrode) 112 is installed along the LED chip 61. Further, as shown in FIG. 18B, on the lower surface of the package type LED, the "P" terminal (electrode) 111 is installed at opposite ends thereof, and the "N" terminal (electrode) 112 is installed in the center thereof.

For example, the package type LED has an advantage that it is possible to easily exchange the LEDs in the unit of package, while in a case where a breakdown such as a disconnection in one LED occurs, in a case where individual differences of the LEDs are uniformized, or in similar cases, if the directly mounted LED is employed instead of the package type LED, it is necessary to exchange the LEDs in the unit of the LED surface 52 or in the unit of the light emitting device substrate 43. One package is not necessarily formed by one LED, but may be formed by a plurality of (for example, 1×3, 3×3) LEDs.

Figure 19:
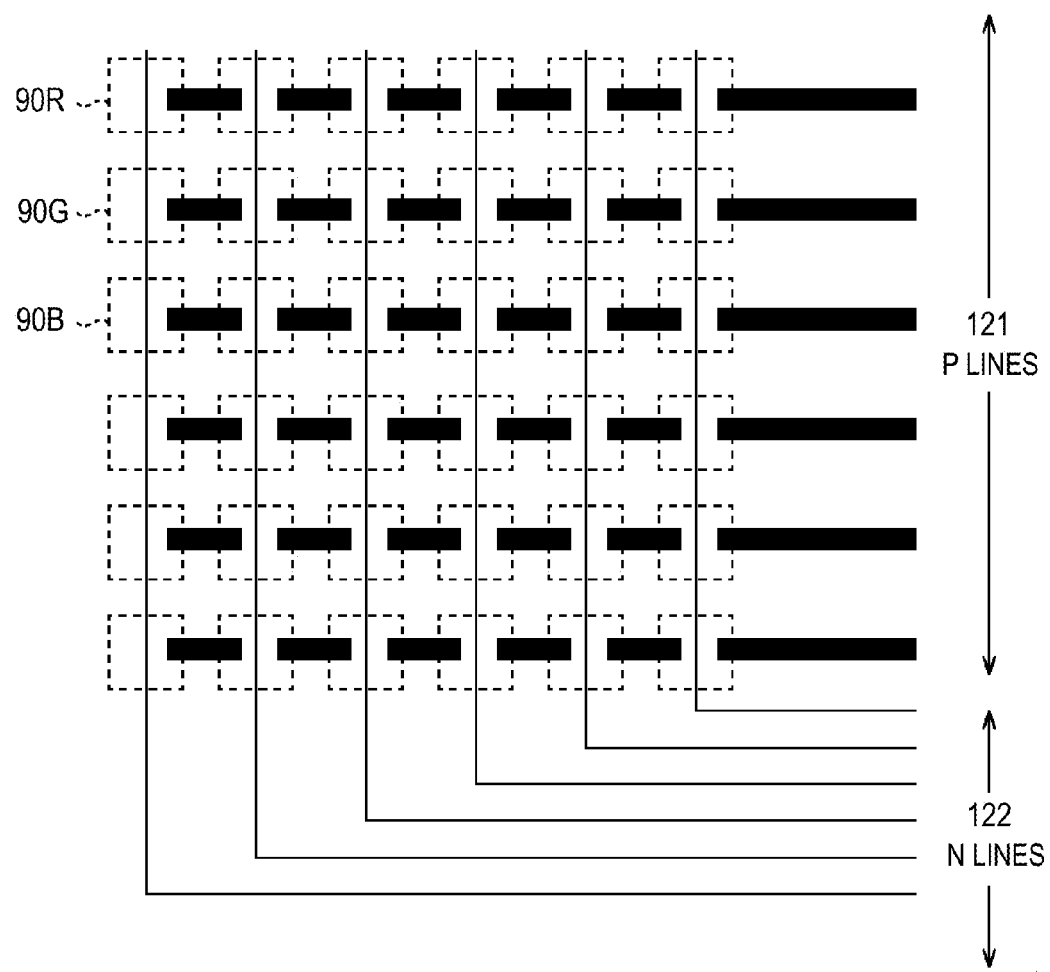
FIG. 19 is a diagram illustrating a third wiring example corresponding to the package type LED.

FIG. 19 illustrates a third wiring example corresponding to a case where the LED which forms the LED surface 52 is the package type LED. The longitudinal direction in the figure corresponds to the length direction of the LED surface 52. In the third wiring example, "P" lines 121 and "N" lines 122 for driving the LEDs are arranged in the lattice form. Here, in the figure, as the "P" lines 121 are intermittently wired and the package type LED shown in FIGS. 18A and 18B is arranged, portions where the "P" lines 121 are disconnected are connected to each other.

As the third wiring example is employed, it is possible to drive and control the LEDs which form the LED surface 52 in a line sequential manner in the unit of several p, seconds.

[Adjustment of LED Light Distribution Characteristic]

As described above, as the first to fifth configuration examples are employed for the LED, it is possible to enhance the directional characteristic. However, for example, if the LED in which the irradiation direction thereof is adjusted to be focused in a direction other than the front direction is used as the LED of the LED surface 52 which is arranged in an end part or the like of the screen on the curved surface of the array displays, it is possible to further enhance the light usage efficiency. Specifically, for example, the package type LED in the irradiation direction suitable for the arrangement may be used, or the light distribution characteristic for each light emitting device substrate 43 is adjusted to be different and the light emitting device substrates 43 having the light distribution characteristic suitable for the arrangement are arrayed, to thereby form the array displays.

Thus, a configuration of the LED in which the light distribution characteristic is adjusted will be described.

Figure 20:
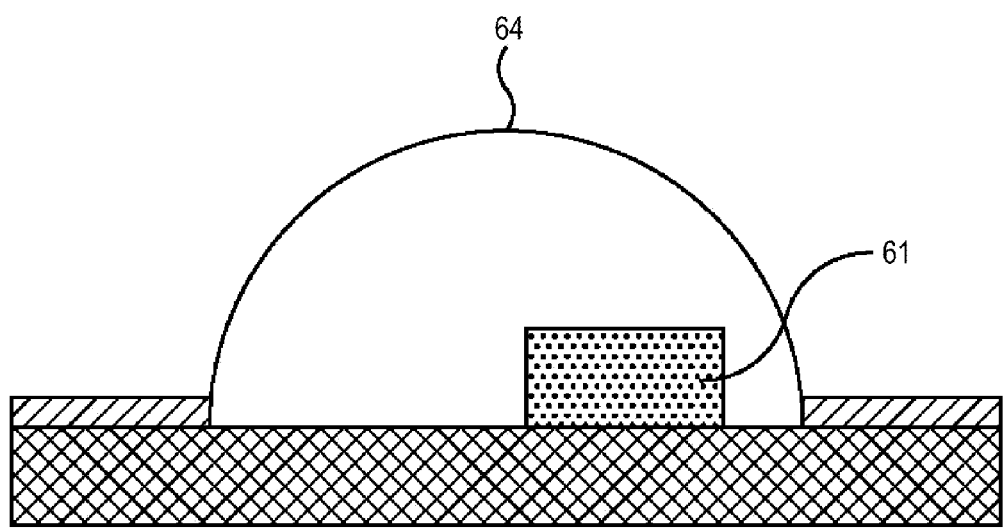
FIG. 20 is a cross-sectional view of a sixth configuration example of the LED.

FIG. 20 illustrates a sixth configuration example of the LED which forms the LED surface 52. In the sixth configuration example, the center of the LED chip 61 installed on the substrate 60 and the center of the circular resin lens 64 are offset to each other. In the sixth configuration example and thereafter, the wire 62, the resin coat 72, the mask 81, and the like may be appropriately omitted in the figures.

Figure 21:
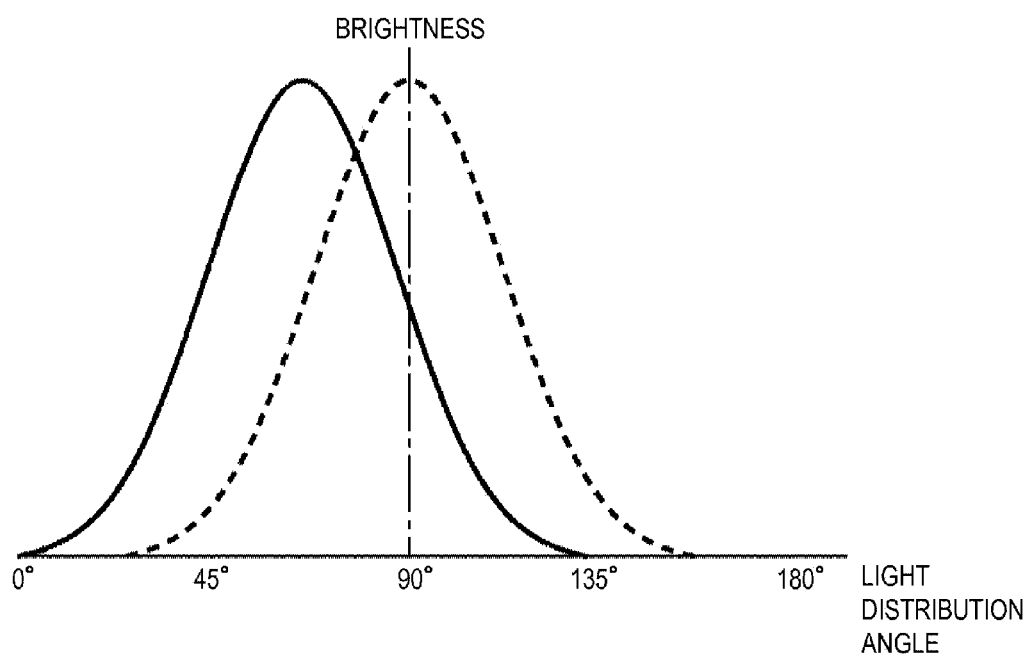
FIG. 21 is a diagram illustrating a light distribution characteristic corresponding to the sixth configuration example of the LED.

FIG. 21 illustrates a light distribution characteristic (indicated by a dashed line) of the first configuration example of the LED shown in FIG. 7 and a light distribution characteristic (indicated by a solid line) of the sixth configuration example of the LED shown in FIG. 20. As shown in the figure, in the case of the first configuration example, the light distribution characteristic is highest in the front (90°) direction. On the other hand, in the case of the sixth configuration example, the light distribution characteristic may be shifted in a direction different from the front direction (90°).

FIGS. 22A and 22B illustrate a seventh configuration example of the LED which forms the LED surface 52, in which FIG. 22A illustrates a cross-section taken in an arbitrary X direction, and FIG. 22B illustrates a cross-section taken in a Y direction which is perpendicular to the X direction. In the seventh configuration example, the circular resin lens 64 is formed to cover the LED chip 61 around the LED chip 61 installed on the substrate 60, and a reflector 131 is installed around the LED chip 61. Here, the reflector 131 functions to enhance the directional characteristic in the X direction and to lower the directional characteristic in the Y direction (to distribute light in a wide range).

Figure 23A:
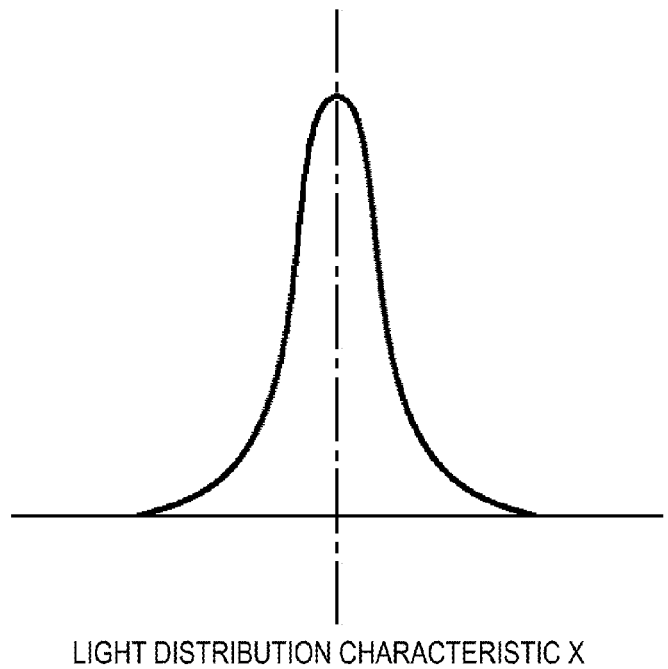
FIGS. 23A and 23B are diagrams illustrating a light distribution characteristic corresponding to the seventh configuration example of the LED.
Figure 23B:
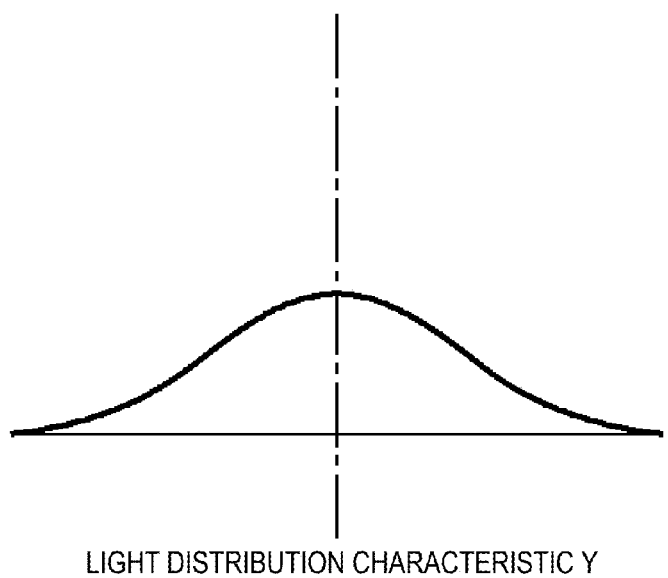

FIGS. 23A and 23B illustrate a light distribution characteristic of the seventh configuration example of the LED shown in FIGS. 22A and 22B, in which FIG. 23A illustrates the light distribution characteristic in the X direction and FIG. 23B illustrates the light distribution characteristic in the Y direction. As understood from the figures, due to the effect of the reflector 131, the directional characteristic is enhanced in the X direction and the directional characteristic is lowered in the Y direction (light distribution range is widened).

Figure 24:
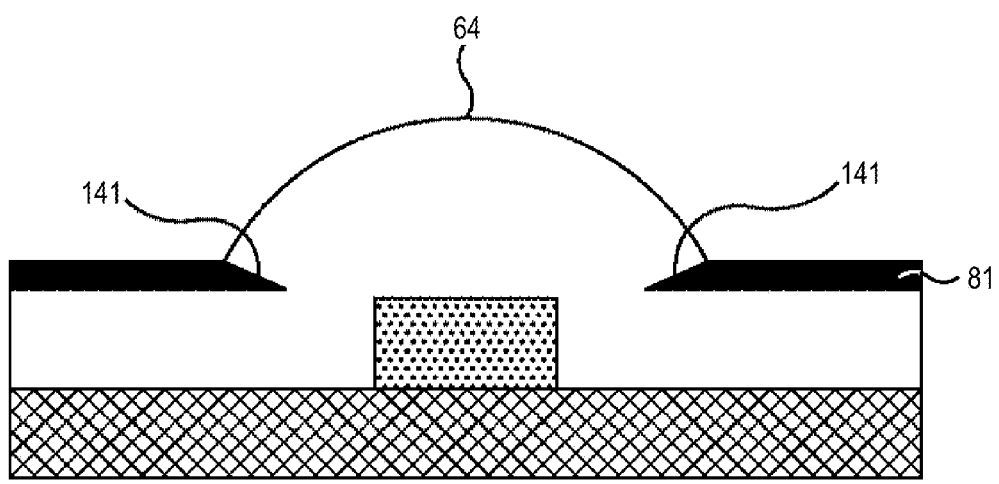
FIG. 24 is a cross-sectional view of an eighth configuration example of the LED.

FIG. 24 illustrates an eighth configuration example of the LED which forms the LED surface 52. In the eighth configuration example, a cross-sectional shape of the mask 81 is formed in the state shown in FIG. 10A, and the hole wall surface thereof is coated or deposited by a reflection material of white color, silver color, or the like to function as a reflector 141. If a position having an effect of the reflector 141 and a position without the effect are provided according to the position of an inclined surface of the mask 81, it is possible to achieve the same light distribution characteristic as the light distribution characteristic shown in FIGS. 23A and 23B.

FIG. 25 illustrates a ninth configuration example of the LED which forms the LED surface 52. In the ninth configuration example, an elliptical resin lens 64 in which a slit direction is the length direction thereof is formed to cover the LED chip 61 installed on the substrate 60. According to the ninth configuration example, it is possible to achieve the same light distribution characteristic as the light distribution characteristic shown in FIGS. 23A and 23B.

FIGS. 26A and 26B illustrate a tenth configuration example of the LED which forms the LED surface 52. In the tenth configuration example, in addition to the characteristic of the ninth configuration example, the center of the LED chip 61 and the center of the elliptical resin lens 64 are offset to each other. According to the tenth configuration example, it is possible to achieve the light distribution characteristic obtained by combining the light distribution characteristics shown in FIG. 21 and FIGS. 23A and 23B.

Figure 27A:
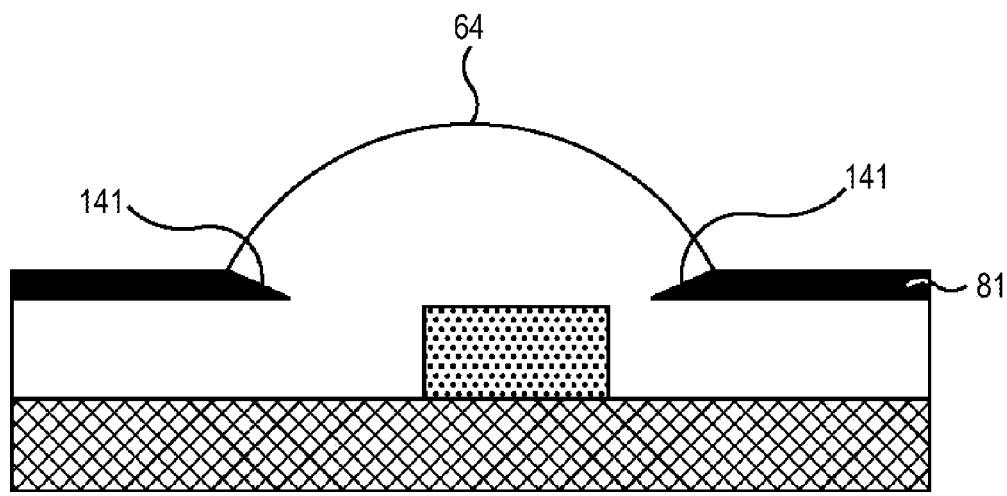
FIGS. 27A and 27B are top views of an eleventh configuration example of the LED.
Figure 27B:
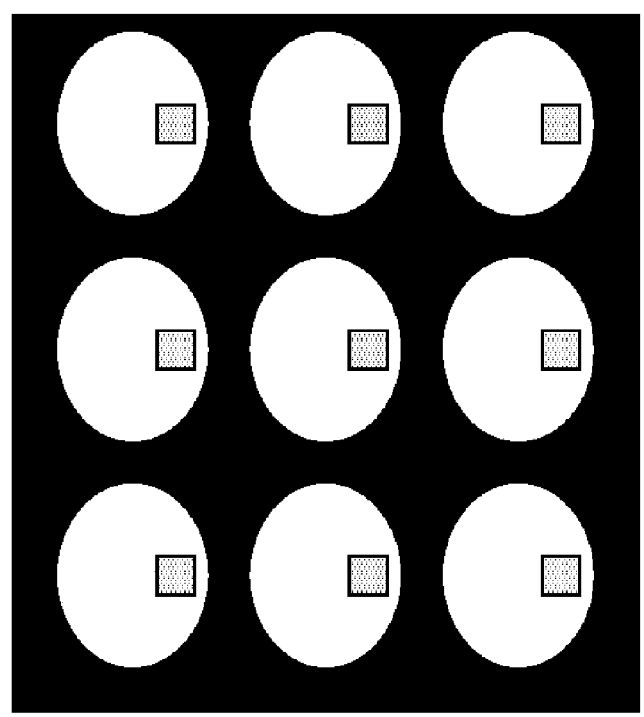

FIGS. 27A and 27B illustrate an eleventh configuration example of the LED which forms the LED surface 52, in which FIG. 27A is a cross-sectional view thereof and FIG. 27B is a top view of the LED surface 52 including the LEDs according to the eleventh configuration example. The eleventh configuration example is a combination of the eighth to tenth configuration examples, and has the light distribution characteristic obtained by combining the light distribution characteristics shown in FIG. 21 and FIGS. 23A and 23B.

As in the above-described sixth to eleventh configuration examples of the LED, if the package type LEDs are used as the LEDs in which the light distribution characteristic is adjusted for each LED and a suitable LED is used according to the arrangement, it is possible to enhance light usage efficiency and to reduce power consumption. Further, it is possible to reduce stray light (light irradiation in an insignificant direction). Further, since it is easy to exchange the LEDs compared with the case where the LED is directly mounted, adjustment and repair are easily available.

Incidentally, it is assumed that the configuration examples, arrangement examples, wiring examples, or the like of the LEDs as described above are applied to the omni-directional 3D image display apparatus 30, but may be applied to other displays.

Further, in the present description, the term "system" represents the entire system including a plurality of devices.

The present disclosure is not limited to the above-described embodiments, and may have a variety of modifications in the range without departing from the spirit thereof.

The present disclosure contains subject matter related to that disclosed in Japanese Priority Patent Application JP 2010-155732 filed in the Japan Patent Office on Jul. 8, 2010, the entire contents of which is hereby incorporated by reference.

What is claimed is:

1. A light emitting device comprising:
   a light emitting chip arranged on a substrate, the substrate having an upper surface;
   a resin lens formed to cover the light emitting chip;
   wherein a center of the light emitting chip and a center of the resin lens are offset so that the centers do not match each other;
   a mask having a plurality of holes, the mask having a lower surface facing the upper surface of the substrate; and
   a resin layer located between the lower surface of the mask and the upper surface of the substrate.

2. The light emitting device according to claim 1,
   wherein the resin lens is formed in a form of a circle having a same aspect ratio in an X direction on the substrate and in a Y direction on the substrate which is perpendicular to the X direction.

3. The light emitting device according to claim 1,
   wherein the resin lens is formed in a form of an ellipse having different aspect ratios in an X direction on the substrate and in a Y direction on the substrate which is perpendicular to the X direction.

4. The light emitting device according to claim 1,
   wherein the mask covers an area other than the resin lens.

5. The light emitting device according to claim 1,
   wherein the mask is formed of a black matte metal.

6. The light emitting device according to claim 1,
   wherein the mask is processed so that the surface thereof has low reflectivity.

7. The light emitting device according to claim 1,
   wherein the mask is processed so that a wall surface of a hole in the plurality of holes has high reflectivity.

8. The light emitting device according to claim 1,
   wherein the mask is formed so that a cross-sectional shape of a lower layer thereof is narrower than that of an upper layer thereof.

9. The light emitting device according to claim 1,
   wherein the mask is formed so that a cross-sectional shape of a lower layer thereof is wider than that of an upper layer thereof.

10. The light emitting device according to claim 1, wherein the resin layer comprises some of the resin used to form the resin lens.

11. The light emitting device according to claim 1, wherein the resin layer covers a wire connected to the light emitting chip.

12. The light emitting device according to claim 1, wherein a height of the resin layer is lower than a height of a light emitting surface of the light emitting chip.

13. The light emitting device according to claim 1, wherein a height of the resin layer is higher than a height of a light emitting surface of the light emitting chip.

14. The light emitting device according to claim 1, wherein the resin layer has a lower surface facing the upper surface of the substrate and an upper surface facing the lower surface of the mask.

15. The light emitting device according to claim 14, wherein the device further comprises a low surface tension film located between the lower surface of the mask and the upper surface of the substrate.

16. The light emitting device according to claim 1, wherein:
   the mask has an upper surface opposite its lower surface; and
   the device further comprises a low surface tension film located over the upper surface of the mask.

* * * * *